(12) United States Patent
Lesea

(10) Patent No.: US 6,437,713 B1
(45) Date of Patent: Aug. 20, 2002

(54) PROGRAMMABLE LOGIC DEVICE HAVING AMPLITUDE AND PHASE MODULATION COMMUNICATION

(75) Inventor: Austin H. Lesea, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/684,211

(22) Filed: Oct. 6, 2000

(51) Int. Cl.[7] ............................................... H03M 7/00
(52) U.S. Cl. ............................ 341/78; 326/41; 375/324
(58) Field of Search ........................... 341/78; 327/277, 327/158, 284, 161, 239; 326/41, 39, 40; 375/324, 375; 395/500.49

(56) References Cited

U.S. PATENT DOCUMENTS

| | | | | |
|---|---|---|---|---|
| 3,982,190 A | * | 9/1976 | Schaefer | 327/231 |
| 5,465,076 A | * | 11/1995 | Yamauchi et al. | 327/277 |
| 5,489,864 A | * | 2/1996 | Ashuri | 327/161 |
| 5,646,564 A | | 7/1997 | Erickson et al. | |
| 5,712,884 A | * | 1/1998 | Jeong | 375/375 |
| 5,744,991 A | * | 4/1998 | Jefferson et al. | 327/158 |
| 5,796,673 A | * | 8/1998 | Foss et al. | 327/284 |
| 5,815,016 A | * | 9/1998 | Erickson | 327/158 |
| 5,914,616 A | * | 6/1999 | Young et al. | 326/41 |
| 5,943,490 A | * | 8/1999 | Sample | 395/500.49 |
| 6,148,038 A | * | 11/2000 | Drost et al. | 375/324 |
| 6,275,084 B1 | * | 8/2001 | McAdams | 327/239 |

OTHER PUBLICATIONS

XAPP132 (v.2.2), "Using the Virtex Delay–Locked Loop", available from Xilinx, Inc., 2100 Logic Drive, San Jose, CA 95124, May 23, 2000, pp. 1–15.

* cited by examiner

*Primary Examiner*—Peguy Jeanpierre
*Assistant Examiner*—Jean Bruner JeanGlaude
(74) *Attorney, Agent, or Firm*—T. Lester Wallace

(57) ABSTRACT

A programmable logic device makes better use of its I/O terminals (for example, package pins) by both amplitude and phase encoding a stream of multi-bit digital values into a single DATA signal. Information in the DATA signal is encoded into four different voltage levels and four different phases. The DATA signal is communicated from the FPGA via just one I/O terminal, as opposed to many I/O terminals. An amplitude/phase encoder is described that includes a delay line in a delay-locked loop, as well as two other delay lines that are slaved to the delay line of the delay-locked loop. The slaved delay lines are used to phase encode the information into the DATA signal. An amplitude/phase decoder is also described that enables the programmable logic device to receive and decode such a DATA signal. The amplitude/phase decoder includes a delay line in a delay-locked loop, as well as two other delay lines that are slaved to the delay line of the delay-locked loop. The slaved delay lines are used to decode the phase information from the DATA signal.

22 Claims, 8 Drawing Sheets

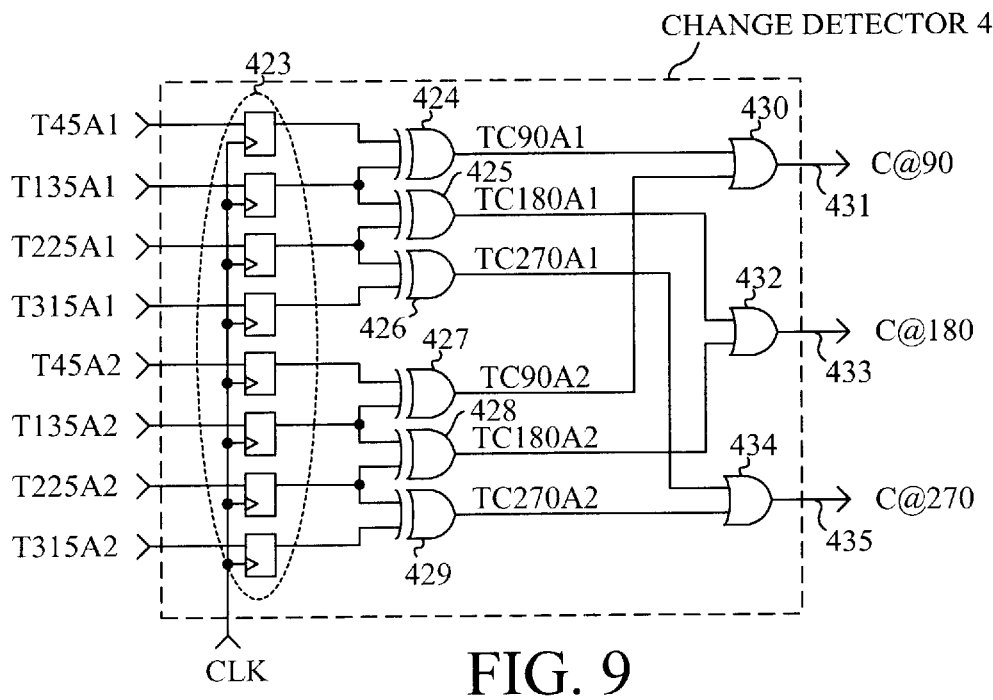
FIG. 9
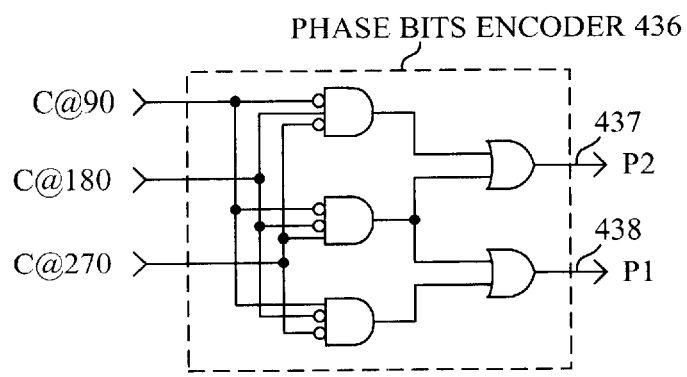
FIG. 10
| C@90 | C@180 | C@270 | P2 | P1 |
|---|---|---|---|---|
| 0 | 0 | 0 | 0 | 0 |
| 1 | 0 | 0 | 0 | 1 |
| 0 | 1 | 0 | 1 | 0 |
| 0 | 0 | 1 | 1 | 1 |
FIG. 11

PROGRAMMABLE LOGIC DEVICE HAVING AMPLITUDE AND PHASE MODULATION COMMUNICATION

CROSS-REFERENCE TO RELATED APPLICATIONS

The present application relates to the following co-pending U.S. patent applications:

Ser. No. 09/482,741, entitled "Deskewing Clock Signals For Off-Chip Devices", filed Jan. 13, 2000, by Bapat et al.;

Ser. No. 09/337,855, entitled "Realizing Analog-To-Digital Converter On A Digital Programmable Integrated Circuit", filed Jun. 21, 1999, by Austin H. Lesea;

Ser. No. 09/363,941, entitled "Programmable Logic Device With Delay-Locked Loop", filed Jul. 29, 1999, by Schultz et al.;

Ser. No. 09/102,740, entitled "Delay Lock Loop With Clock Phase Shifter", filed Jun. 22, 1998, by Hassoun et al.; and Ser. No. 09/452,234, entitled "Method and Apparatus for Adjusting Delay in a Delay Locked Loop for Temperature Variations", filed Dec. 1, 1999, by Austin H. Lesea, all of which are hereby incorporated herein by reference.

TECHNICAL FIELD

This invention relates to a method and apparatus for communication with a programmable logic device using both amplitude and phase modulation.

BACKGROUND INFORMATION

A field programmable gate array (FPGA) available from Xilinx Inc. of San Jose, Calif., includes multiple delay-locked loops (DLLs). One such DLL is., for example, usable to provide low clock skew between a clock signal output from the FPGA and a clock signal internal to the FPGA. The FPGA is, however, configurable so that a user can use the DLL for other purposes. For additional information on a Xilinx FPGA and its DLLs, see: 1) U.S. patent application Ser. No. 09/482,741 entitled "Deskewing Clock Signals For Off-Chip Devices", by Bapat et al., filed Jan. 13, 2000; and 2) XAPP 132, "Using the Virtex Delay-Locked Loop", v.2.2, pages 1–15 (May 23, 2000), both of which documents are incorporated herein by reference.

An FPGA of the type described above generally interacts with external circuitry by sending signals to the external circuitry from input/output (I/O) terminals of the FPGA and/or by receiving signals from external circuitry via I/O terminals of the FPGA. The term "FPGA" as it is used here denotes an FPGA integrated circuit housed in an integrated circuit package. Accordingly, each signal passing onto or from the FPGA integrated circuit passes through an I/O terminal of the package. Over time, there has been an increase in the size and complexity of FPGA integrated circuits, but there has not been a commensurate increase in the number of I/O terminals available on standard packages. Consequently, the functionality of user-specific designs realized using such FPGAs is sometimes "I/O constrained". The FPGA integrated circuit can be designed to have the desired I/O resources, but the packages available for containing the FPGA integrated circuit have a restrictively small number of I/O terminals available. Not only are today's user-specific designs often "I/O constrained" in this way, but the divergence between the I/O capability of the FPGA integrated circuit and the I/O capability of the package is likely to widen in the future. A solution is desired.

SUMMARY

A programmable logic device (for example, a field programmable gate array) makes better use of its I/O terminals (for example, its package pins) by both amplitude and phase encoding information into a single DATA signal. This single DATA signal can be transmitted from or received onto the FPGA via just one I/O terminal, as opposed to many I/O terminals. In one specific example, information is encoded into four different voltage levels and four different phases. An amplitude/phase encoder is described that includes a delay line in a delay-locked loop, as well as two other delay lines that are slaved to the delay line of the delay-locked loop. The slaved delay lines are used to phase encode the information into the DATA signal. An amplitude/phase decoder is also described that includes a delay line in a delay-locked loop, as well as two other delay lines that are slaved to the delay line of the delay-locked loop. The slaved delay lines are used to decode the phase information from the DATA signal. A coding scheme is employed to ensure that an amplitude change occurs in the data such that the decoder can properly detect encoded phase information.

Other embodiments are described in the detailed description below. This summary does not purport to define the invention. The invention is defined by the claims.

BRIEF DESCRIPTION OF THE DRAWINGS

FIG. 9 is a simplified diagram of a change detector of the amplitude/phase decoder of FIG. 6.

FIG. 10 is a simplified diagram of a phase-bits encoder of the amplitude/phase decoder of FIG. 6.

FIG. 11 is a logic table for the phase-bits encoder of FIG. 10.

DETAILED DESCRIPTION

Figure 1:
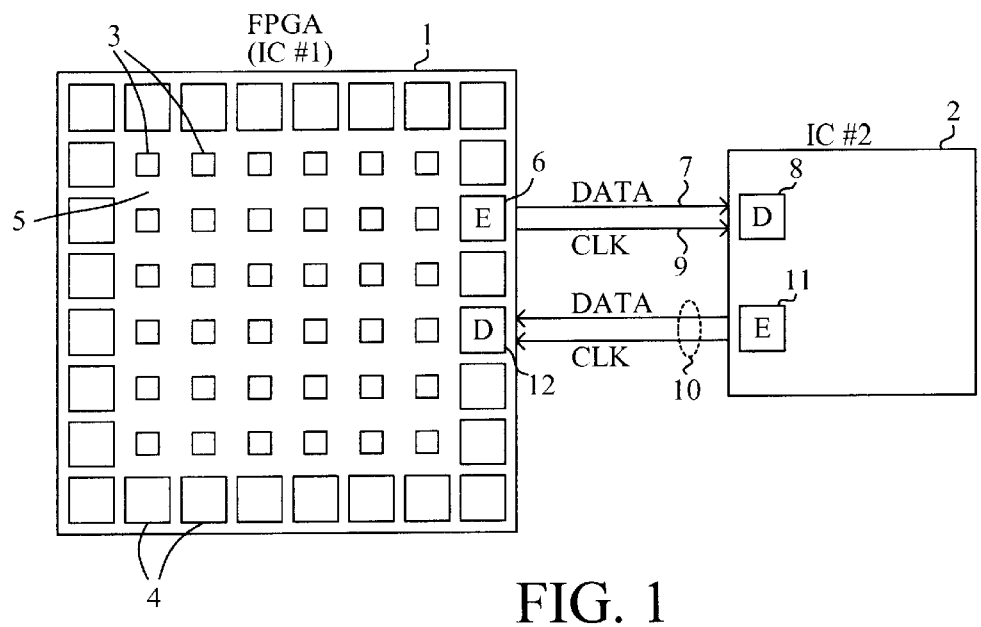
FIG. 1 illustrates a programmable logic device 1 (for example, an FPGA) communicating with a second integrated circuit 2 using both amplitude and phase modulation.

FIG. 1 is a simplified top-down diagram of a first integrated circuit 1 that communicates with a second integrated circuit 2 in accordance with an embodiment of the present invention. The first integrated circuit is, in this example, a field programmable gate array having an inner core of configurable logic blocks (CLBs) 3 that is surrounded by a ring of input/output blocks (IOBs) 4. A programmable interconnect structure 5 is configurable to couple selected ones of the CLBs and IOBs together such that the resulting circuit is a user-specific circuit desired by a user. In one embodiment, the FPGA architecture is substantially as described in "The Programmable Logic Data Book 2000", pages 3–5 through 3–74, available from Xilinx, Inc., which pages are incorporated herein by reference. Each one of IOBs 4 includes an I/O terminal (not shown) through which the FPGA can communicate with external circuitry. In one embodiment, the I/O terminal is a bonding pad that is wire-bonded to one pin of an IC package that contains the FPGA integrated circuit. For additional information on one suitable IOB structure, see co-pending U.S. patent application Ser. No. 09/337,855, entitled "Realizing Analog-To-Digital Converter On A Digital Programmable Integrated Circuit", filed Jun. 21, 1999, by Austin H. Lesea (the subject matter of which is incorporated herein by reference).

Rather than transmitting a stream of multi-bit digital values in parallel fashion from first integrated circuit 1 to second integrated circuit 2, the stream of multi-bit digital values is encoded by an amplitude/phase encoder 6 on integrated circuit 1 such that the multi-bit digital information is encoded in at least four levels of amplitude and in at least four different phases. The amplitude/phase encoded signal is then output onto an I/O terminal (not shown) and propagates via a communication medium 7 (for example, a metal trace on a printed circuit board) to second integrated circuit 2. An amplitude/phase decoder 8 on the second integrated circuit 2 receives the signal on an I/O terminal (not shown) and decodes the amplitude and phase information of the signal into a stream of multi-bit digital values. The amplitude/phase encoded signal can either be transmitted with an accompanying clock signal CLK such as is shown in FIG. 1 being communicated via a communication medium 9 (for example, a second metal trace on the printed circuit board), or alternatively no clock signal is transmitted. If no clock signal is transmitted, then second integrated circuit 2 may employ clock recovery circuitry to generate a clock signal suitable to decode the amplitude/phase encoded signal.

In the embodiment of FIG. 1, a second channel 10 is provided for communicating from second integrated circuit 2 to first integrated circuit 1. Second integrated circuit 2 therefore includes an amplitude/phase encoder 11 similar to amplitude/phase encoder 6 and first integrated circuit 1 includes an amplitude/phase decoder 12 similar to amplitude/phase decoder 8.

Figure 2:
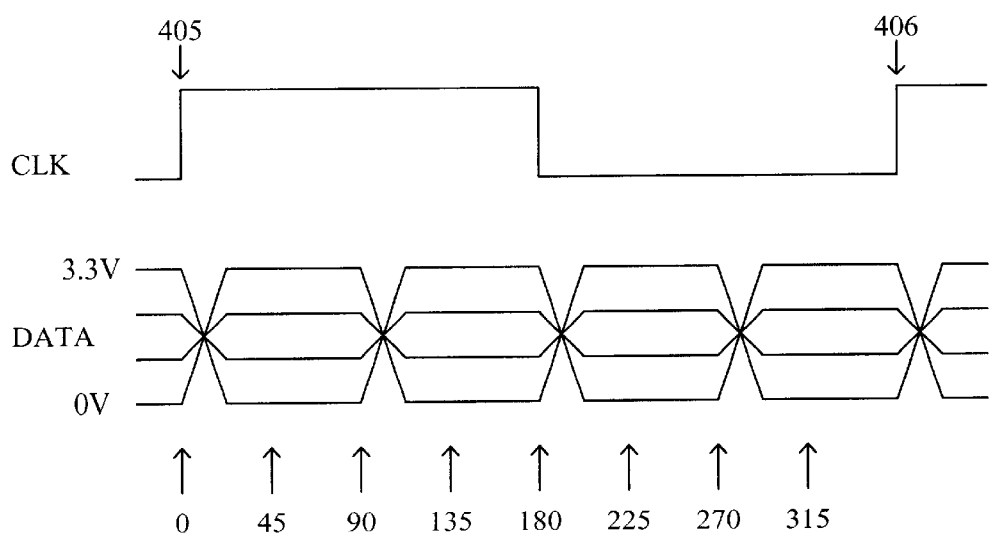
FIG. 2 is a simplified waveform diagram of data (DATA) and clock (CLK) signals associated with the communication of FIG. 1.

FIG. 2 is a simplified waveform diagram showing the data (DATA) transmitted from encoder 6 to decoder 8 as well as accompanying clock signal CLK. In this case, each value of the stream of multi-bit digital values is a four-bit value. Each four-bit value is encoded into one of four logic levels and one of four phases. In the example of FIG. 2, the four logic levels are 3.3 volts, two thirds of 3.3 volts, one third of 3.3 volts, and zero volts. In the example of FIG. 2, the four phases are a phase change to the new logic level at zero degrees, a phase change to the new logic level at ninety degrees, a phase change to the new logic level at one hundred eighty degrees, and a phase change to the new logic level at two hundred seventy degrees. As illustrated in FIG. 2, the phase change information is relative to the phase of the accompanying clock signal CLK.

Figure 3:
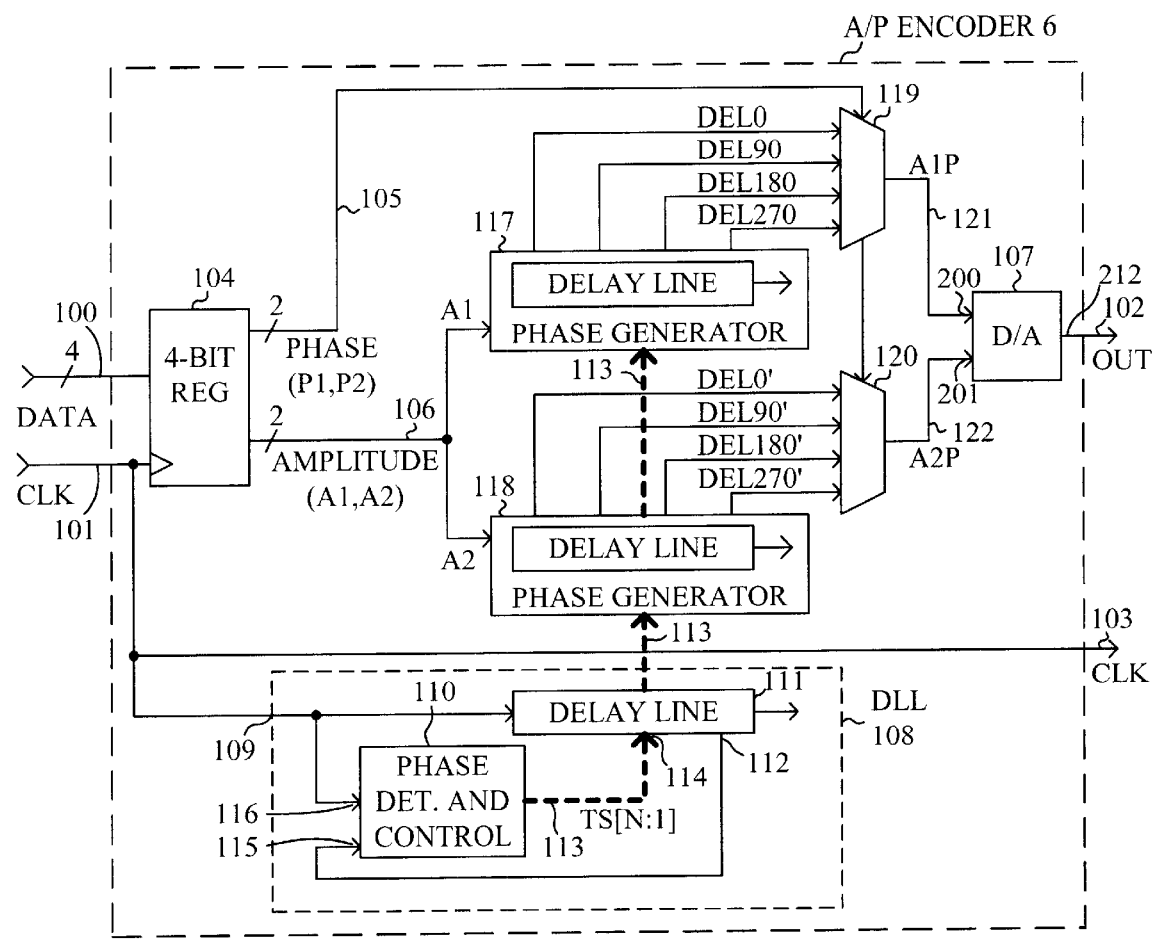
FIG. 3 is a simplified diagram of an amplitude/phase encoder of the programmable logic device of FIG. 1.

FIG. 3 is a simplified block diagram of one possible embodiment of amplitude/phase encoder 6 of FIG. 1. Amplitude/phase encoder 6 receives as inputs from other circuitry on FPGA 1: 1) the serial stream of four-bit digital values on four data leads 100, and 2) the clock signal CLK on clock input lead 101. Amplitude/phase encoder 6 encodes this stream of four-bit digital values into a signal DATA such as shown in FIG. 2, and this signal DATA is output on an output lead OUT 102. Clock signal CLK is passed through the amplitude/phase encoder 6 so that it appears on output lead CLK 103. Output lead OUT 102 is coupled to a first I/O terminal (not shown) of FPGA 1 and output lead CLK 103 is coupled to a second I/O terminal (not shown) of FPGA 1. These I/O terminals are coupled to the communication media 7 and 9 illustrated in FIG. 1.

In operation, the bits of a four-bit digital value on input leads 100 are clocked in parallel into a four-bit register 104 on the rising edge of the clock signal CLK on clock input lead 101. Two of these bits (P1,P2) are designated "phase" bits and are output from register 104 on lines 105. The other two of these bits (A1,A2) are designated "amplitude" bits and are output from register 104 on lines 106. The amplitude information carried in the "amplitude" bits is delayed to change from the prior amplitude information to the current amplitude information at a phase determined by the "phase" bits. Once delayed to have the appropriate phase, the information carried in the "amplitude" bits is converted into the corresponding one of four logic levels (i.e., voltage levels) by a digital-to-analog (D/A) converter 107.

This delay in phase is accomplished using a delay-locked loop (DLL) 108. The clock signal CLK is supplied to an input 109 of the delay-locked loop (DLL) 108. DLL 108 includes phase detector and control circuitry 110 as well as a tapped delay line 111. The phase detector and control circuitry 110 controls which tap of the delay line 111 is coupled to delay line output lead 112. Phase detector and control circuitry 110 performs this controlling function by controlling a multi-bit tap select value TS[N:1] supplied via lines 113 to the tap select input leads 114 of tapped delay line 111. Phase detector and control circuitry 110 controls TS[N:1] such that delay line 111 delays the clock signal CLK one period, the signal being fed back from output lead 112 to input lead 115 having substantially the same phase as the phase of clock signal CLK supplied onto input lead 116.

For additional information on suitable structures for DLL 108, see: 1) U.S. patent application Ser. No. 09/482,741, entitled "Deskewing Clock Signals for Off-Chip Devices", filed Jan. 13, 2000, by Bapat et al.; 2) U.S. patent application Ser. No. 09/363,941, entitled "Programmable Logic Device With Delay-Locked Loop", filed Jul. 29, 1999, by Schultz et al.; 3) U.S. patent application Ser. No. 09/102,740, entitled "Delay Lock Loop With Clock Phase Shifter", filed Jun. 22, 1998, by Hassoun et al.; 4) U.S. Pat. No. 5,646,564; and 5) Xilinx Application Note, XAPP132 v. 2.2, entitled "Using The Virtex Delay-Locked Loop", pages 1–15 (May 23, 2000). (The subject matter of these documents is incorporated herein by reference).

Each of two phase generators 117 and 118 includes a delay line that is substantially identical to delay line 111. The delays between each successive pair of taps of a delay line are substantially identical. Because these three delay lines are substantially identical, and because the tap select value TS[N:1] that taps delay line 111 so that a delay of one complete period of the clock signal CLK (i.e., 360 degrees) is present on lines 113 in the DLL, the tap select value corresponding to half of that value (i.e., half of 360 degrees is 180 degrees) is easily determined. One half of binary tap select value TS[N:1] is the value TS[N:1] shifted one bit (0, TS[N]:TS[2]). Similarly, the tap select value corresponding to one quarter of the 360 degree tap select value is easily determined. One quarter of tap select value TS[N:1] is the value TS[N:1] shifted two bits (0, 0, TSN:TS[3]). Also, the tap select value corresponding to three quarters of the 360 degree tap select value is determined by adding the tap select value for 180 degrees to the tap select value for 90 degrees.

A zero degrees delayed signal is obtained by selecting the signal at the input of the delay line before the signal is delayed by the delay line.

Each of phase generators 117 and 118 uses the tap select value TS[N:1] supplied by DLL 108 to output phase delayed signals of: zero degrees phase delay, 90 degrees phase delay, 180 degrees phase delay, and 270 degrees phase delay. Phase generator 117 delays the first amplitude bit A1, whereas phase generator 118 delays the second amplitude bit A2. Which of the four phase-delayed versions of the amplitude bits is chosen depends on the value of the two "phase" bits. For example, if the two "phase" bits are "00", then the phase bits cause 4-to-1 multiplexers 119 and 120 to output the zero degree delayed versions of amplitude bits A1 and A2 onto multiplexer output lines 121 and 122, respectively. If the two "phase" bits are "01", then the multiplexers 119 and 120 output the 90 degrees delayed versions of amplitude bits A1 and A2 onto multiplexer output lines 121 and 122, respectively. If the two "phase" bits are "10", then the multiplexers 119 and 120 output the 180 degrees delayed versions. And lastly, if the two "phase" bits are "11", then the multiplexers 119 and 120 output the 270 degrees delayed versions.

Once the two "amplitude" bits have been phase-delayed the appropriate amount, the two-bit amplitude value on lines 121 and 122 is converted by D/A converter 107 into a corresponding one of four voltage levels (i.e., 3.3 volts, two-thirds of 3.3 volts, one-third of 3.3 volts, or zero volts). The result is a signal on output lead 102 that has its two "amplitude" bits (A1,A2) encoded as one of four possible voltage levels and that has its two "phase" bits (P1,P2) determining where in phase the amplitude changes to the new voltage level.

Figure 4:
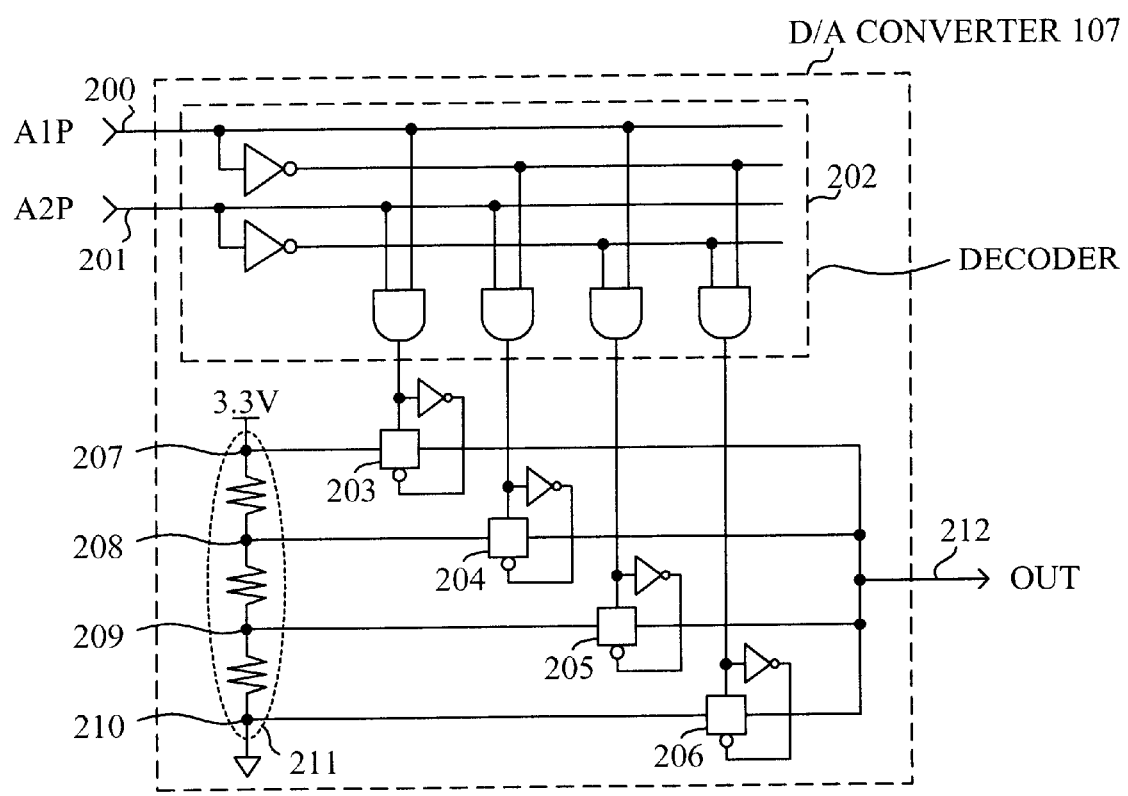
FIG. 4 is a simplified diagram of a D/A converter of the amplitude/phase encoder of FIG. 3.

FIG. 4 is a more detailed diagram of an embodiment of D/A converter 107. This D/A converter is a two-bit D/A converter. The two-bit digital value present on its two input leads 200 and 201 is decoded by digital decoder 202 to turn on the appropriate one of CMOS pass gates 203–206 such that the appropriate node 207–210 on a resistor string 211 is coupled to an output lead 212. An analog buffer (an amplifier of unity voltage gain) is provided (not shown) between output lead 212 and the I/O terminal through which the signal DATA passes from FPGA 1.

Figure 5:
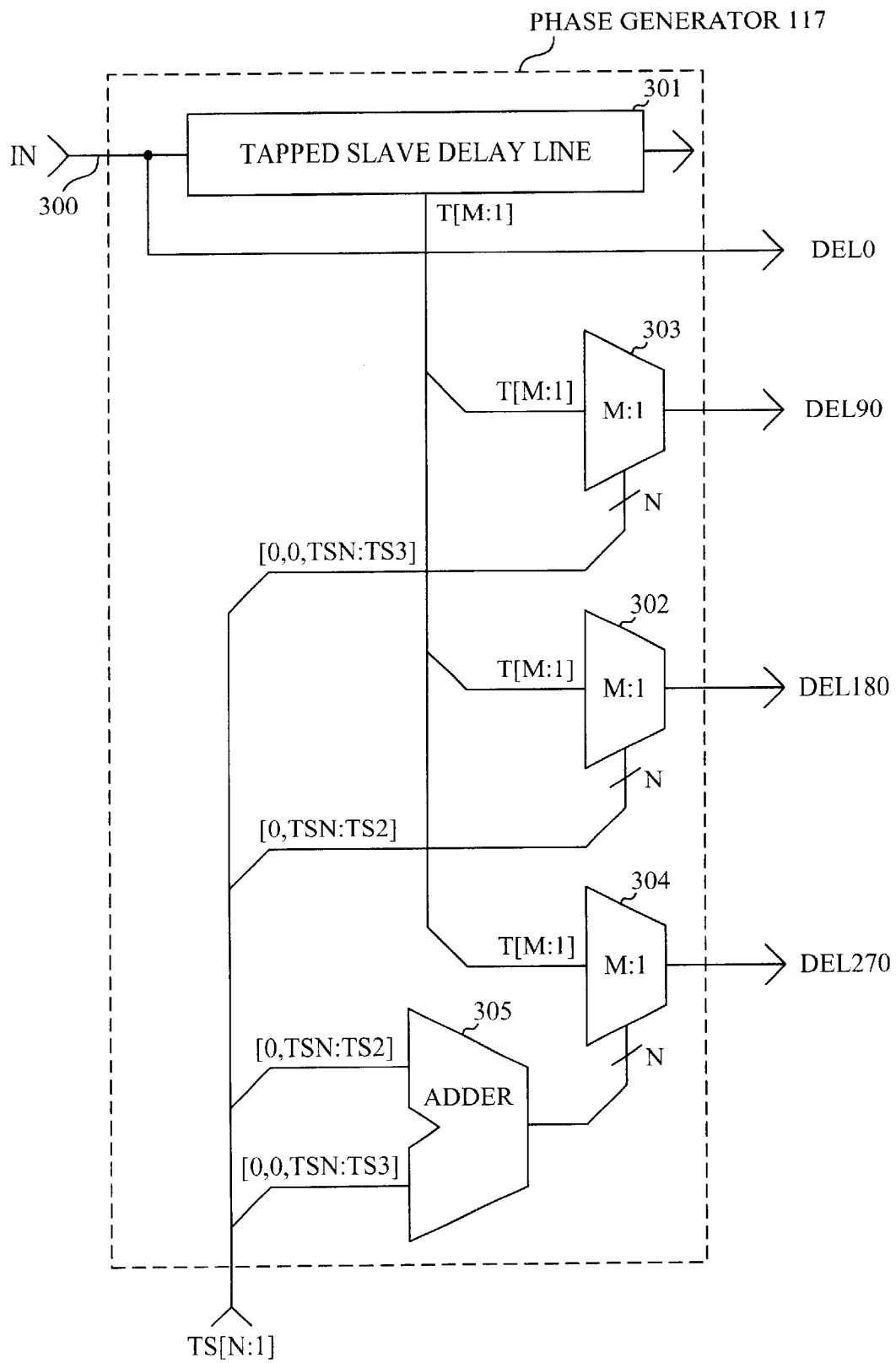
FIG. 5 is a simplified diagram of a phase generator of the amplitude/phase encoder of FIG. 3.

FIG. 5 is a more detailed diagram of an embodiment of phase generator 117 (phase generator 118 is identical to phase generator 117). The "amplitude" bit A1 is input on input lead 300. Tapped slave delay line 301 is substantially identical to delay line 111 of DLL 108. T[M:1] denotes the M tap signals from the respective M taps of the delay line 301. TS[N:1] denotes the N-bit tap select value received from DLL 108. Each of the reference numerals DEL0, DEL90, DEL180 and DEL270 in FIG. 5 refers to both a phase-delayed signal as well as to a corresponding phase-delay output lead that carries the signal.

The zero degree phase-delay signal DEL0 is seen passing straight through the phase generator 117 without being delayed by the delay line 301. An M-to-1 multiplexer 302 couples the appropriate one of the M tap signals to the 180 degree phase-delay output lead DEL180. As explained above, the tap selected is determined by the tap select value 0,TSN:TS2 (TS[N:1] logically shifted one bit such that the least significant bit TS1 is omitted and such that a zero is shifted into the most significant bit position). An M-to-1 multiplexer 303 couples the appropriate one of the M tap signals to the 90 degree phase-delay output lead DEL90. As explained above, the tap selected is determined by the tap select value 0,0,TSN:TS3 (TS[N:1] logically shifted two bits such that the two least significant bits TS2 and TS1 are omitted and such that two zeros are shifted into the two most significant bit positions). An M-to-1 multiplexer 304 couples the appropriate one of the M tap signals to the 270 degree phase-delay output lead DEL270. As explained above, the tap selected is determined by the tap select value obtained by adding the tap select value for 90 degrees and the tap select value for 180 degrees. A binary adder 305 is provided for this purpose.

The three tapped delay lines of DLL 108 and phase generators 117 and 118 can be realized in many ways. In one embodiment, a string of CMOS buffers is used. A CMOS buffer comprises two CMOS inverters. M nodes along the string (one node every so many buffers) supply the T[M:1] tap signals shown in FIG. 5. Delay line 111 differs slightly from the other two delay lines in this embodiment in that it includes a multiplexer (not shown), the select input leads of which are coupled to receive the tap select value TS[N:1], the M data input leads of which are coupled to the M respective taps of the delay line, and the data output lead of which is illustrated in FIG. 3 as output lead 112. In some embodiments, the supply voltage to the CMOS inverters in each buffer string is adjusted as a function of temperature so as to offset temperature-caused inverter-speed changes. For additional information on such temperature compensation, see U.S. patent application Ser. No. 09/452,234, entitled "Method and Apparatus for Adjusting Delay in a Delay Locked Loop for Temperature Variations", filed Dec. 1, 1999, by Austin H. Lesea, the subject matter of which is incorporated herein by reference.

Figure 6:
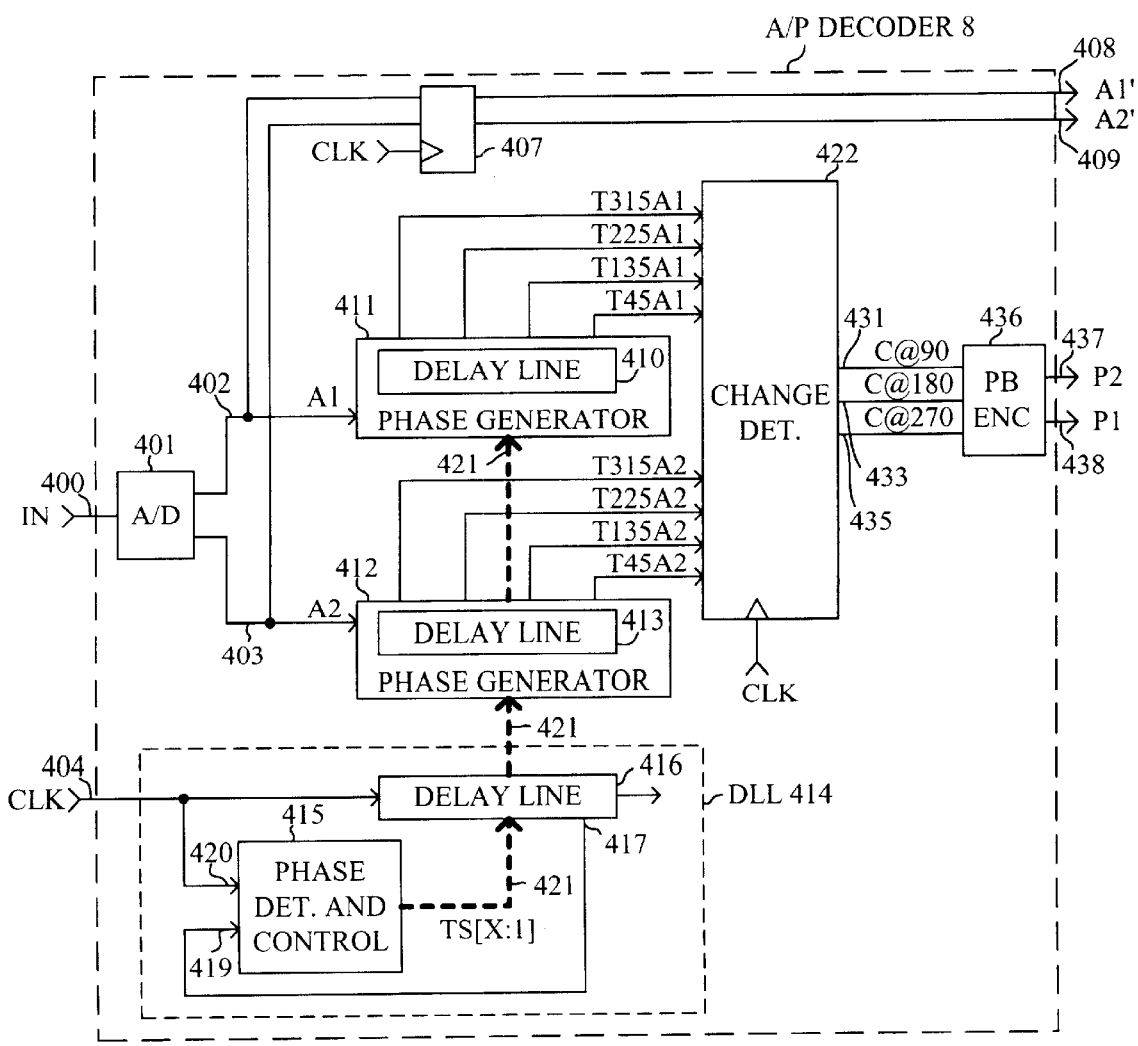
FIG. 6 is a simplified diagram of an amplitude/phase decoder of the programmable logic device of FIG. 1.

FIG. 6 is a simplified block diagram of one possible embodiment of amplitude/phase decoder 8 of FIG. 1. The amplitude and phase encoded signal from transmission medium 7 is received on input lead 400 via an I/O terminal (not shown) of the FPGA integrated circuit package and a bonding pad (not shown) of the FPGA integrated circuit. The amplitude of the amplitude and phase encoded signal is then converted into a two-bit digital value by two-bit flash analog-to-digital (A/D) converter 401 such that the least significant bit A1' appears on line 402 and such that the most significant bit A2' appears on line 403.

Figure 7:
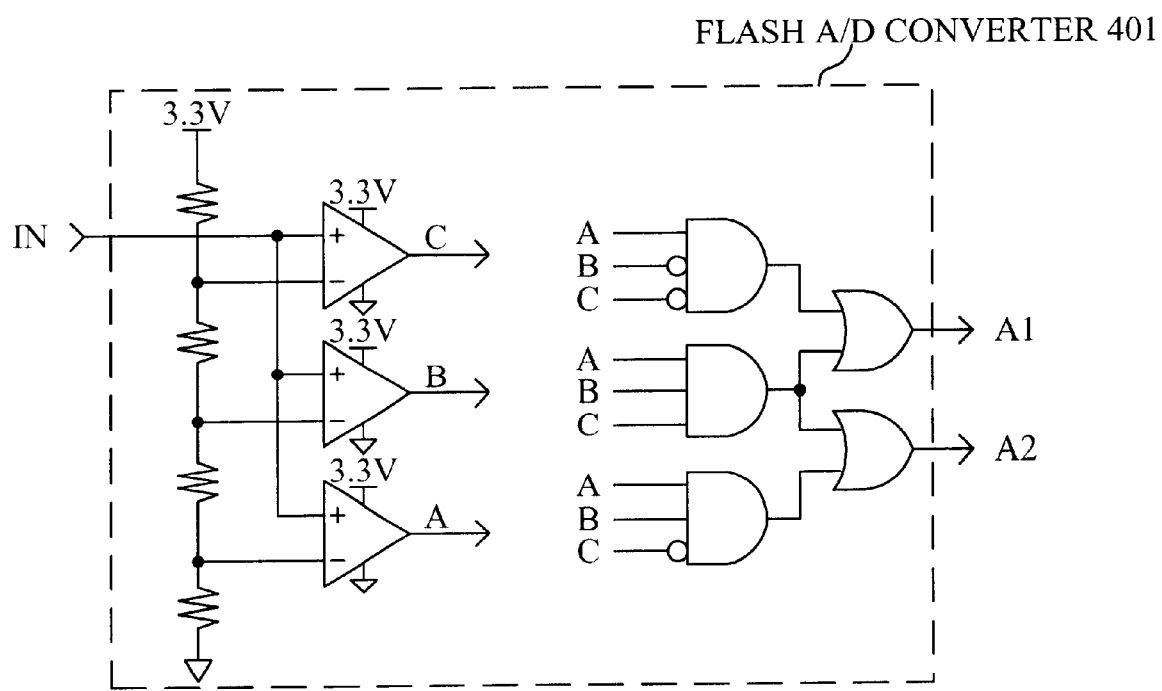
FIG. 7 is a simplified diagram of an A/D converter of the amplitude/phase decoder of FIG. 6.

FIG. 7 is a simplified diagram of one possible embodiment of A/D converter 401.

The clock signal CLK from transmission medium 9 is received on input lead 404 of decoder 8 via an I/O terminal (not shown) of the FPGA integrated circuit package and via a corresponding bonding pad (not shown) of the FPGA integrated circuit.

As explained above in connection with FIG. 3, a four-bit data value clocked into 4-bit register 104 of encoder 6 (see FIG. 3) causes a phase change to a new amplitude value on output lead 102. If a four-bit data value is clocked into 4-bit register 104 at clock edge 405 (see FIG. 2), then the associated phase change will be completed before the next clock edge 406 (see FIG. 2). Amplitude/phase decoder 8 therefore captures the two amplitude bits A1 and A2 on lines 402 and 403 at time 406 by clocking them into a two-bit register 407 using the clock signal CLK. These two captured amplitude bits A1 and A2 appear on output leads 408 and 409 as signals A1' and A2', respectively.

The phase information in the signal on input lead 400 is recovered by determining the phase at which the amplitude of the signal changed. To make this determination, an amplitude bit (for example, amplitude bit A1) is supplied to the data input lead of a tapped delay line (for example, tapped delay line 410 of phase generator 411. The phase at which the amplitude bit change occurred is determined by examining the signals on taps of the delay line and identifying between which two taps the amplitude bit changed logic levels. In the example of FIG. 6, there are four such signals T315A1, T225A1, T135A1 and T45A1 from taps of a delay line 410. In FIG. 6, each of reference numerals T315A1, T225A1, T135A1, T45A1, T315A2, T225A2, T135A2, and T45A2 refers to one of the phase-delay signals as well as to the corresponding phase-delay output lead that carries the signal.

If, for example, after waiting one clock period of clock signal CLK, a change in logic level is detected between taps at the beginning of the tapped delay line 410, then the phase change in bit A1 occurred later in the clock period. For example, a difference in logic level between phase-delay signal T315A1 (corresponding to a 315 degree phase delay) and phase-delay signal T225A1 (corresponding to a 225 degree phase delay) indicates a phase change of 270 degrees.

On the other hand, if the change in logic level is detected between taps farther down the tapped delay line 410, then the phase change in bit A1 occurred earlier in the clock period (the change in logic level has had a longer time to propagate down the delay line.) For example, a difference in logic level between phase-delay signal T135A1 (corresponding to a 135 degree phase delay) and phase-delay signal T45A1 (corresponding to a 45 degree phase delay) indicates a phase change of 90 degrees.

Because there are two amplitude bits A1 and A2, only one of them may exhibit a change in logic level in a given clock period. A second phase generator 412 having a second tapped delay line 413 is therefore provided for detecting logic level changes in amplitude bit A2.

Figure 8:
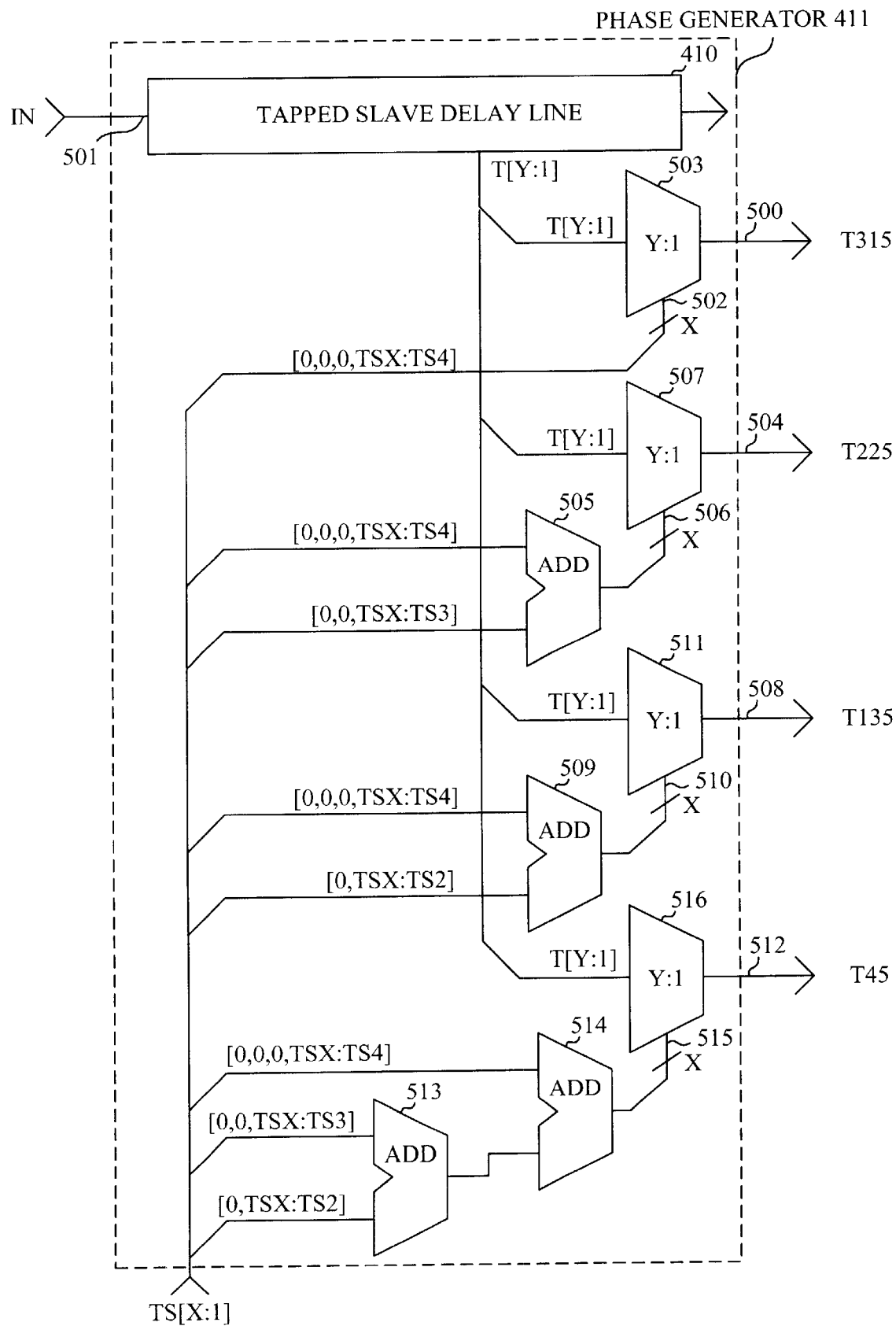
FIG. 8 is a simplified diagram of a phase generator of the amplitude/phase decoder of FIG. 6.

FIG. 8 is a diagram of one possible embodiment of phase generator 411 of FIG. 6 (phase generator 412 is of identical construction). The tap select value TS[X:1] in FIG. 8 is an X-bit digital value that identifies which tap of the Y taps of delay line 410 corresponds to a delay of one clock period of the clock signal CLK. On each respective one of the Y taps, there is a corresponding one of Y tap signals T[Y:1].

Phase-delay signal T315 is supplied onto phase-delay output lead 500 by coupling onto phase-delay output lead 500 the one of the Y tap signals T[Y:1] that corresponds to a delay of 45 degrees from delay line input lead 501. Because tap select value TS[X:1] corresponds to the tap of 360 degrees, a logical shift of the value TS[X:1] by three bits (0,0,0, TS[X:4]) corresponds to the tap of 45 degrees. The value (0,0,0, TS[X:4]) is therefore supplied onto the select input leads 502 of Y:1 multiplexer 503 such that the appropriate tap is coupled to phase-delay output lead 500 for phase-delay signal T315. The delay line tap corresponding to 45 degrees on delay line 410 is coupled to the phase-delay signal T315 rather than a delay line tap corresponding to 315 degrees because a signal that was delayed in encoder 6 to phase change 315 degrees into the clock period of signal CLK would only have had time to propagate 45 degrees down the delay line in decoder 8.

The phase-delay signal T225 is supplied onto phase-delay output lead 504 by coupling onto phase-delay output lead 504 the one of the Y tap signals T[Y:1] that corresponds to a delay of 135 degrees from delay line input lead 501. An adder 505 generates the tap select value corresponding to a delay of 135 degrees by adding the tap select value corresponding to 45 degrees (0,0,0, TS[X:4]) to the tap select value corresponding to 90 degrees (0,0,TS[X:3]). The value generated by adder 505 is supplied to the select input leads 506 of Y:1 multiplexer 507 such that the appropriate tap is coupled to phase-delay output lead 504.

The phase-delay signal T135 is supplied onto phase-delay output lead 508 by coupling onto phase-delay output lead 508 the one of the Y tap signals T[Y:1] that corresponds to a delay of 225 degrees from delay line input lead 501. An adder 509 generates the tap select value corresponding to a delay of 225 degrees by adding the tap select value corresponding to 45 degrees (0,0,0, TS[X:4]) to the tap select value corresponding to 180 degrees (0,TS[X:2]). The value generated by adder 509 is supplied to the select input leads 510 of Y:1 multiplexer 511 such that the appropriate tap is coupled to phase-delay output lead 508.

The phase-delay signal T45 is supplied onto phase-delay output lead 512 by coupling onto phase-delay output lead 512 the one of the Y tap signals T[Y:1] that corresponds to a delay of 315 degrees from delay line input lead 501. Two adders 513 and 514 generate the tap select value corresponding to a delay of 315 degrees by summing: 1) the tap select value corresponding to 45 degrees (0,0,0,TS[X:4]); 2) the tap select value corresponding to 90 degrees (0,0,TS[X:2]); and the tap select value corresponding to 180 degrees (0,TS[X:2]). The value generated is supplied to the select input leads 515 of Y:1 multiplexer 516 such that the appropriate tap is coupled to phase-delay output lead 512.

The tap select value TS[X:1] corresponding to a phase delay of 360 degrees is generated by a DLL 414 (see FIG. 6). DLL 414 includes phase detector and control circuitry 415 as well as a tapped delay line 416. Delay lines 416, 410 and 413 are matched so that the same tap select value TS[X:1] on lines 421 (see FIG. 6) identifies the tap corresponding to a 360 degree delay in delay lines 410 and 413 as well as in delay line 416. In this embodiment, each of delay lines 416, 410 and 413 involves its own string of buffers, the Y taps of the delay line being nodes spaced evenly every so many buffers down the buffer string. Delay line 416 differs, in this embodiment, from delay lines 410 and 413 in that delay line 416 includes a multiplexer, the Y data input leads of which are coupled to the Y respective taps of the buffer string, the select inputs of which are coupled to the X tap select lines 421, and the data output lead of which is the delay line output lead 417 of delay line 416.

Phase detector and control circuitry 415 of DLL 414 controls which tap of delay line 416 is output on tapped delay line output lead 417. Phase detector and control circuitry 415 makes this determination by controlling the tap select value TS[X:1] supplied via lines 421 to tapped delay line 416. Phase detector and control circuitry 415 controls TS[X:1] such that delay line 416 delays the clock signal CLK one period, the delayed clock signal being fed back from output lead 417 to input lead 419 having substantially the same phase as the phase of clock signal CLK supplied onto input lead 420.

A change detector 422 is employed to identify between which two of the phase-delay output leads of phase generators 411 and 412 there occurred an amplitude bit change. FIG. 9 is a more detailed diagram of one possible implementation of change detector 422 of FIG. 6. As explained above, the phase change for a four-bit value clocked into the encoder 6 at time 405 (see FIG. 2) will have occurred by the next rising clock edge at time 406. The phase-delay signals (T315A1, T225A1, T135A1, T45A1, T315A2, T225A2, T135A2, T45A2) on the phase-delay output leads of phase generators 411 and 412 are therefore captured in an eight-bit register 423 using the clock signal CLK. Exclusive-OR gates 424–429 detect if their successive phase-delay signals differ. For example, if phase-delay signals T45A1 and T135A1 differ, then exclusive-OR gate 424 asserts tap change signal TC90A1 high, indicating a change in phase in bit A1 between 45 degrees and 135 degrees (90 degrees is the only phase change value that encoder 6 could have encoded between 45 degrees and 135 degrees). If phase-delay signals T135A1 and T225A1 differ, then exclusive-OR gate 425 asserts tap change signal TC180A1 high, indicating a change in phase in bit A1 between 135 degrees and 225 degrees (180 degrees is the only phase change value that encoder 6 could have encoded between 135 degrees and 225 degrees). If phase-delay signals T225A1 and T315A1 differ, then exclusive-OR gate 426 asserts tap change signal TC270A1 high, indicating a change in phase in bit A1 between 225 degrees and 315 degrees (270 degrees is the only phase change value encoder 6 could have encoded between 225 degrees and 270 degrees). Exclusive-OR gates 427–429 operate in similar fashion to detect changes in phase in bit A2.

If a phase change is detected at 90 degrees in either bit A1 or A2, then OR-gate 430 asserts change at 90 degrees signal C@90 high on line 431. If a phase change is detected at 180 degrees in either bit A1 or A2, then OR-gate 432 asserts change at 180 degrees signal C@180 high on line 433. If a phase change is detected at 270 degrees in either bit A1 or A2, then OR-gate 434 asserts change at 270 degrees signal C@270 high on line 435.

FIG. 10 is a circuit diagram of phase-bits encoder 436 of FIG. 6. Phase-bits encoder 436 encodes the three phase change signals C@90, C@180 and C@270 into a two-bit phase value (P2,P1). Phase bit P1 is the least significant bit. FIG. 11 is a table that illustrates the encoding performed by phase-bits encoder 436. As indicated in the first row of the table, if none of C@90 and C@180 and C@270 is asserted, then the phase change is assumed to have occurred at zero degrees. This zero degrees phase change is encoded with P1 being a "0" and P2 being "0". The encoded phase bits appear on the output leads 437 and 438 of the phase-bits encoder 436 and these output leads are the output leads of the amplitude/phase decoder 8 (see FIG. 6). Accordingly, the four-bit digital value clocked into register 104 of encoder 6 (see FIG. 3) at time 405 (see FIG. 2) is recovered on output leads 408, 409, 437 and 438 of decoder 8 (see FIG. 6) shortly after time 406 (see FIG. 2).

Proper operation of the described example of decoder 8 requires that the signal on transmission medium 7 have an amplitude change from clock period to clock period. If there were no change in amplitude, then decoder 8 could not detect a change in phase. An appropriate coding scheme is therefore imposed on the four-bit data values in the stream of data values supplied to encoder 6. In one encoding scheme, if any two successive four-bit values to be encoded by encoder 6 have identical phase bits (P1, P2) and identical amplitude bits (A1,A2), then the most significant amplitude bit (A2) is toggled before the four-bit value is supplied to encoder 6. The most significant amplitude bit (A2) coming out of decoder 8 is ignored. Accordingly, a continuous stream of three-bit values of information is amplitude and phase modulated and is communicated as a single data signal (DATA) between two integrated circuits.

Although the present invention is described in connection with certain specific embodiments for instructional purposes, the present invention is not limited thereto. Although the data signal (DATA) and the clock signal (CLK) are, in the illustrated embodiment, single-ended digital signals, these data and clocks signals are in other embodiments differentially driven signals. The clock signal CLK is not transmitted along with data in some embodiments, but rather the decoder includes a clock recovery circuit that recovers the clock signal from the data signal itself. A stream of digital values can be encoded into more than two amplitude bits and/or more than two phase bits. The illustrated embodiment involving two amplitude bits and two phase bits was chosen for its simplicity so as to clarify the explanation of the invention. The particular coding scheme of ignoring the most significant data bit in the decoder was presented for ease of explanation in connection with the simple modulation example involving only two amplitude bits and only two phase bits. It is to be understood that numerous coding schemes can be employed, depending on a number of factors, including: the number of amplitude and phase bits, the acceptable complexity of the circuitry, and the acceptable complexity of the software doing the coding. In some embodiments, each of the amplitude/phase encoder and decoder blocks is a block of semi-custom or full-custom circuitry that occupies a smaller amount of IC area than it would were it realized using the internal CLBs and programmable interconnect of the FPGA. In other embodiments, parts of the amplitude/phase encoder and decoder are realized using the CLBs and programmable interconnect of the FPGA. Although the illustrated embodiment uses delay-locked loops and slaved delay lines, it is understood that signals can be phase delayed in other ways and that a phase delay of a signal can be detected in other ways. The amplitude/phase encoder and decoder can be user-configurable. They may include user-loadable memory cells, the content of which define operating parameters and/or enable features of the encoder and decoder. Such parameters and features may include: the number of voltage levels of signal DATA, the number of phase changes of signal DATA, the coding scheme used, and whether the DATA signal will be single-ended or differential. In the case of an SRAM-based FPGA, the user-loadable memory cells may be loaded in the same fashion as the other memory cells that configure the FPGA. In one embodiment, a programmable logic device is configurable such that: 1) the delay-locked loop is usable to deskew a clock signal output by the programmable logic device with respect to a clock signal internal to the programmable logic device on a global clock tree, or 2) the delay-locked loop is part of the amplitude/phase encoder. The amplitude/phase encoder and decoder techniques described above are not limited to programmable logic devices or FPGAs, but rather see applicability in integrated circuits in general.

Accordingly, various modifications, adaptations, and combinations of various features of the described embodiments can be practiced without departing from the scope of the invention as set forth in the claims.

What is claimed is:

1. A programmable logic device, comprising:
   a plurality of logic blocks;
   a programmable interconnect structure for coupling selected ones of the logic blocks together;
   a plurality of I/O terminals; and
   an amplitude/phase encoder that encodes a stream of multi-bit values into a signal on one of the I/O terminals, each multi-bit value having at least three bits, the stream of values being encoded such that the multi-bit values are encoded in at least four different logic levels and such that the multi-bit values are encoded in at least four different phases.

2. The programmable logic device of claim 1, wherein the amplitude/phase encoder comprises:
   a first delay line;
   a second delay line; and
   a delay-locked loop (DLL) having a third delay line, the first and second delay lines being slaved to the third delay line.

3. A programmable logic device, comprising:
a plurality of logic blocks;
a programmable interconnect structure for coupling selected ones of the logic blocks together;
a plurality of I/O terminals; and
an amplitude/phase encoder that encodes a stream of multi-bit values into a signal on one of the I/O terminals, each multi-bit value having at least three bits, the stream of values being encoded such that the multi-bit values are encoded in at least four different logic levels and such that the multi-bit values are encoded in at least four different phases, wherein the amplitude/phase encoder comprises:
a register having a clock input lead, a first data output lead, and a second data output lead;
a first phase generator having a first delay line, the first phase generator having a data input lead and having tap select input leads, the data input lead being coupled to the first data output lead of the register;
a second phase generator having a second delay line, the second phase generator having a data input lead and having tap select input leads, the data input lead being coupled to the second data output lead of the register; and
a delay-locked loop (DLL) having a clock input lead, the DLL further comprising a third delay line, the third delay line having tap select input leads, the DLL generating tap select signals, the tap select signals being supplied to the tap select input leads of the first phase generator and to the tap select input leads of the second phase generator and to the tap select input leads of the third delay line.

4. The programmable logic device of claim 3, wherein the first phase generator has a plurality of phase-delay output leads, wherein the second phase generator has a plurality of phase-delay output leads, the amplitude/phase encoder further comprising:
a first multiplexer having a plurality of data input leads, a data output lead, and a plurality of select input leads, the plurality of data input leads being coupled to the phase-delay output leads of the first phase generator;
a second multiplexer having a plurality of data input leads, a data output lead, and a plurality of select input leads, the plurality of data input leads being coupled to the phase-delay output leads of the second phase generator; and
a digital-to-analog converter (D/A) having a first input lead, a second input lead, and an analog output lead, the first input lead being coupled to the data output lead of the first multiplexer, the second input lead being coupled to the data output lead of the second multiplexer.

5. A programmable logic device, comprising:
a plurality of logic blocks;
a programmable interconnect structure for coupling selected ones of the logic blocks together;
a plurality of I/O terminals; and
means for encoding a stream of multi-bit values into a signal on one of the I/O terminals, each multi-bit value having at least three bits, the stream of multi-bit values being encoded such that the multi-bit values are encoded in at least four different logic levels and such that the multi-bit values are encoded in at least four different phases.

6. The programmable logic device of claim 5, wherein the means for encoding comprises a delay-locked loop.

7. The programmable logic device of claim 6, wherein the programmable logic device is configurable such that: 1) the delay-locked loop is usable to deskew a clock signal output by the programmable logic device with respect to a clock signal internal to the programmable logic device on a global clock tree, or 2) the delay-locked loop is part of the means for encoding.

8. A programmable logic device, comprising:
a plurality of logic blocks;
a programmable interconnect structure for coupling selected ones of the logic blocks together;
a plurality of I/O terminals; and
an amplitude/phase decoder that decodes a signal on one of the I/O terminals into a stream of multi-bit values, each multi-bit value of the stream having at least three bits, the stream of multi-bit values being encoded such that the multi-bit values are encoded in at least four different logic levels and such that the multi-bit values are encoded in at least four different phases.

9. The programmable logic device of claim 8, wherein the amplitude/phase decoder comprises:
a first delay line;
a second delay line; and
a delay-locked loop (DLL) having a third delay line, the first and second delay lines being slaved to the third delay line.

10. A programmable logic device, comprising:
a plurality of logic blocks;
a programmable interconnect structure for coupling selected ones of the logic blocks together;
a plurality of I/O terminals; and
an amplitude/phase decoder that decodes a signal on one of the I/O terminals into a stream of multi-bit values, each multi-bit value of the stream having at least three bits, the stream of multi-bit values being encoded such that the multi-bit values are encoded in at least four different logic levels and such that the multi-bit values are encoded in at least four different phases, wherein the amplitude/phase decoder comprises:
an analog-to-digital converter (A/D) having an analog input lead, a first data output lead, and a second data output lead;
a first phase generator having a first delay line, the first phase generator having a data input lead and having tap select input leads, the data input lead being coupled to the first data output lead of the A/D;
a second phase generator having a second delay line, the second phase generator having a data input lead and having tap select input leads, the data input lead being coupled to the second data output lead of the A/D; and
a delay-locked loop (DLL) having a clock input lead, the DLL further comprising a third delay line, the third delay line having tap select input leads, the DLL generating tap select signals, the tap select signals being supplied to the tap select input leads of the first phase generator and to the tap select input leads of the second phase generator and to the tap select input leads of the third delay line.

11. The programmable logic device of claim 10, wherein the first phase generator has a plurality of phase delay output leads, wherein the second phase generator has a plurality of phase delay output leads, the amplitude/phase decoder further comprising:
a change detector having a first plurality of input leads, a second plurality of input leads, and a plurality of output leads, the first plurality of input leads being coupled to the plurality of phase delay output leads of the first phase generator, the second plurality of input leads being coupled to the plurality of phase delay output leads of the second phase generator; and a phase-bits encoder having a plurality of input leads and a plurality of output leads, the plurality of input leads of the phase-bits encoder being coupled to the plurality of output leads of the change detector.

12. The programmable logic device of claim 11, wherein the change detector has a clock input lead, the clock input lead of the change detector being coupled to the clock input lead of the DLL.

13. The programmable logic device of claim 10, wherein the amplitude/phase decoder further comprises:

a register having a first data input lead, a second data input lead, and a clock input lead, the first data input lead of the register being coupled to the first data output lead of the A/D, the second data input lead of the register being coupled to the second data output lead of the A/D, the clock input lead of the register being coupled to the clock input lead of the DLL.

14. A programmable logic device, comprising:

a plurality of logic blocks;

a programmable interconnect structure for coupling selected ones of the logic blocks together;

a plurality of I/O terminals; and means for decoding a signal on one of the I/O terminals into a stream of multi-bit values, each multi-bit value of the stream having at least three bits, the stream of multi-bit bit values being encoded such that the multi-bit values are encoded in at least four different logic levels and such that the multi-bit values are encoded in at least four different phases.

15. The programmable logic device of claim 14, wherein the means for decoding comprises a delay-locked loop.

16. The programmable logic device of claim 15, wherein the programmable logic device is configurable such that: 1) the delay-locked loop is usable to deskew a clock signal output by the programmable logic device with respect to a clock signal internal to the programmable logic device on a global clock tree, or 2) the delay-locked loop is part of the means for decoding.

17. An integrated circuit comprising:

a programmable portion; and an amplitude/phase encoder portion, the amplitude/phase encoder portion encoding a stream of multi-bit values into a signal, the signal being output from the integrated circuit, each of the multi-bit values having at least three bits, the stream of multi-bit values being encoded such that the multi-bit values are encoded into a number of different logic levels and such that the multi-bit values are encoded into a number of different phases, the amplitude/phase encoder portion being user-configurable such that the number of different logic levels is user-selectable.

18. The integrated circuit of claim 17, wherein the signal output from the integrated circuit is a differentially-driven signal.

19. The integrated circuit of claim 17, wherein the signal output from the integrated circuit is a single-ended signal.

20. The integrated circuit of claim 17, wherein the amplitude/phase encoder portion is user-configurable such that a user can select whether the signal output from the integrated circuit is a single-ended signal or is a differentially-driven signal.

21. The integrated circuit of claim 17, wherein the amplitude/phase encoder portion is user-configurable such that the number of different phases is user-selectable.

22. The integrated circuit of claim 17, wherein each of the multi-bit values includes at least two amplitude bits and at least two phase bits.

* * * * *